(12) United States Patent
Masuda et al.

(10) Patent No.: US 6,227,723 B1
(45) Date of Patent: May 8, 2001

(54) SUBSTRATE FOR MOUNTING AN OPTICAL COMPONENT AND OPTICAL MODULE PROVIDED WITH THE SAME

(75) Inventors: Yuji Masuda; Masato Shinya, both of Kyotanabe; Koji Takemura, Kyoto, all of (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/605,242

(22) Filed: Jun. 28, 2000

(30) Foreign Application Priority Data

Jun. 30, 1999 (JP) .................................................. 11-185820
Sep. 1, 1999 (JP) .................................................. 11-247928

(51) Int. Cl.$^7$ ................................ G02B 6/00; G02B 6/36
(52) U.S. Cl. ................................................ 385/88; 257/59
(58) Field of Search .............................. 385/80–90, 147; 174/250; 257/59, 65, 288, 66, 347, 72, 351, 177, 113, 659, 250; 438/146, 588

(56) References Cited

U.S. PATENT DOCUMENTS 3,931,674 * 1/1976 Amelio .................................. 438/144
4,916,502 * 4/1990 Oshima ................................. 257/177
5,194,933 * 3/1993 Miyagi ................................. 257/753
6,104,040 * 8/2000 Kawachi et al. ..................... 257/288

* cited by examiner

Primary Examiner—Akm E. Ullah
(74) Attorney, Agent, or Firm—Hogan & Hartson, LLP

(57) ABSTRACT

A substrate for mounting an optical component is provided with a base member having a semiconductor device mounting portion including a higher located first area to have optical semiconductor devices mounted on its outer surface and a second area which is stepped down from the first area so as to be located lower than the first area; an insulation layer provided in the second area of the base member so as to have substantially the same height as the first area and having a smaller dielectric loss tangent than the base member; and driving electrode patterns provided on the insulation layer for driving the optical semiconductor devices. Further, an optical module is constructed by mounting optical semiconductor devices on the base member and providing an optical waveguide so as to be optically coupled with the optical semiconductor devices.

16 Claims, 11 Drawing Sheets

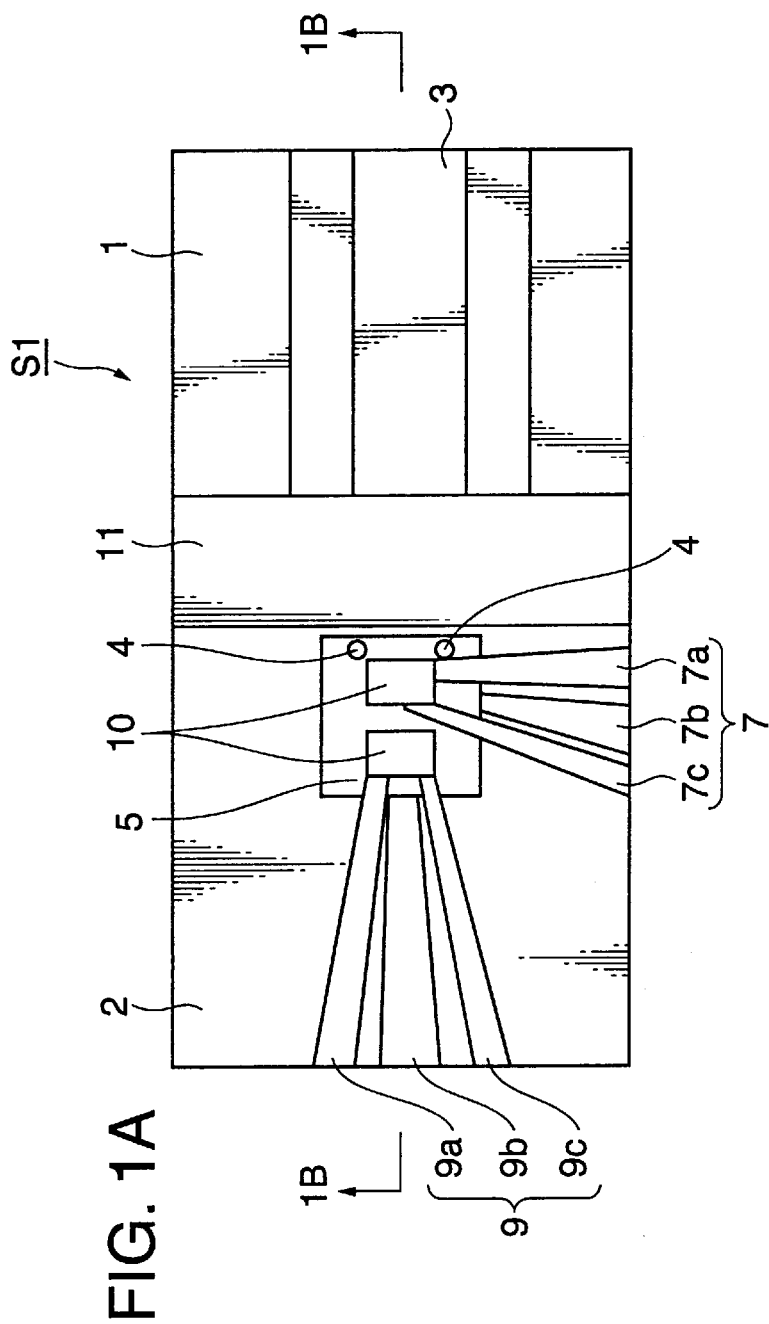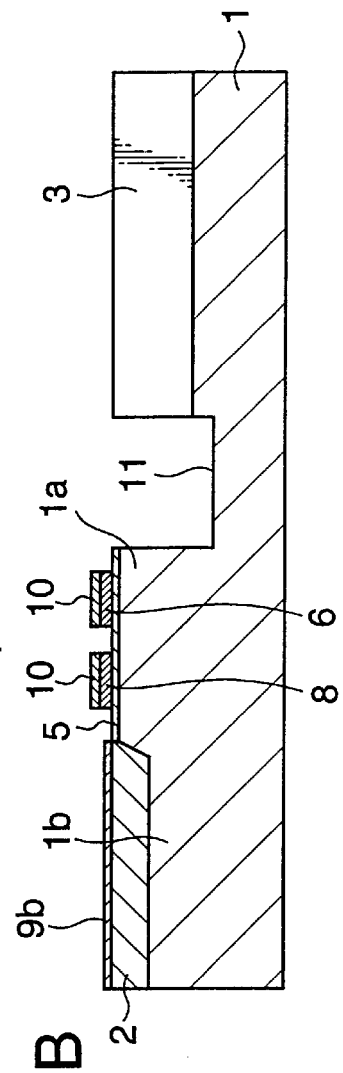

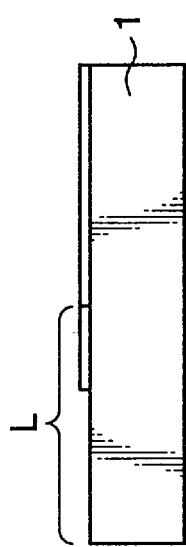
FIG. 2-B1
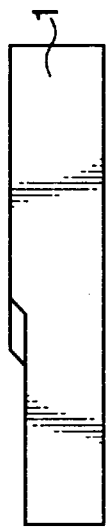
FIG. 2-B2
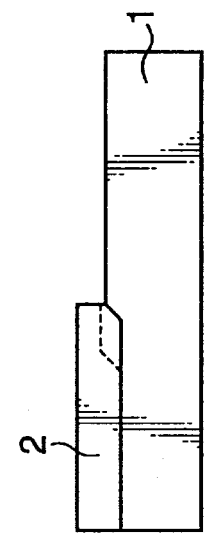
FIG. 2-B3
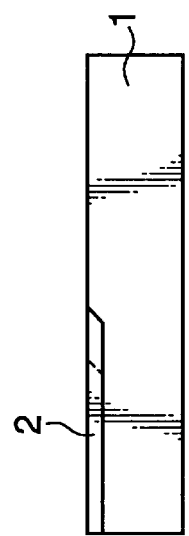
FIG. 2-B4
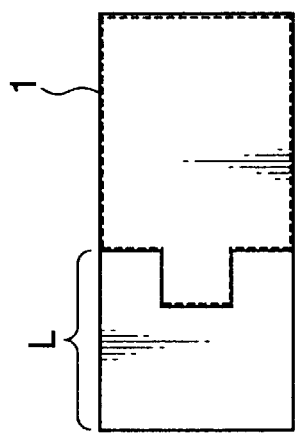
FIG. 2-A1
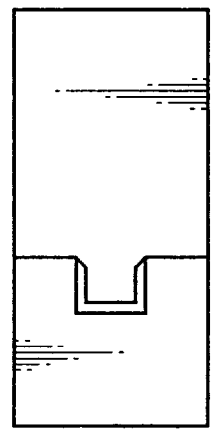
FIG. 2-A2
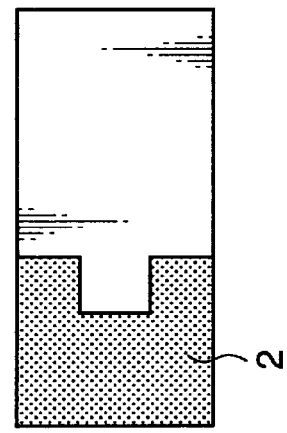
FIG. 2-A3

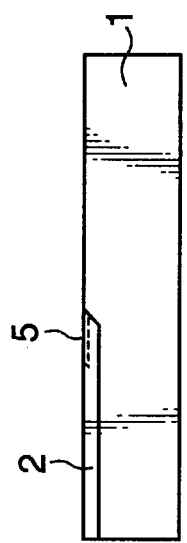
FIG. 3-B5
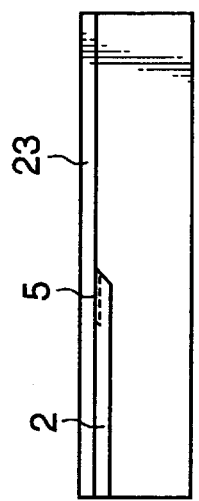
FIG. 3-B6
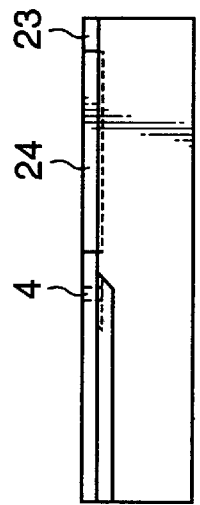
FIG. 3-B7
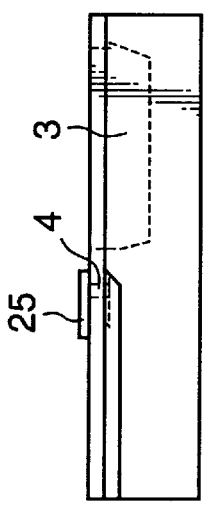
FIG. 3-B8
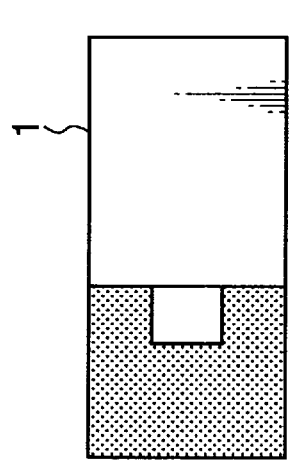
FIG. 3-A5
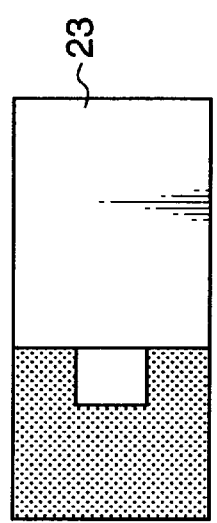
FIG. 3-A6
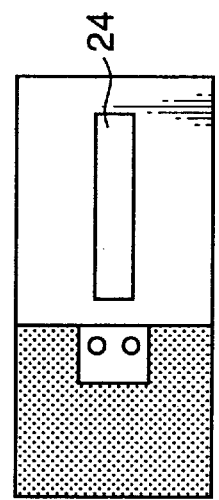
FIG. 3-A7
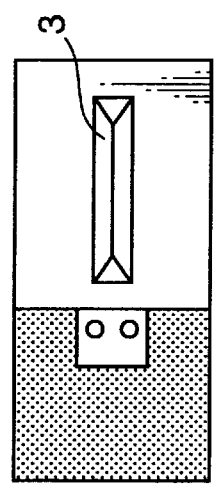
FIG. 3-A8

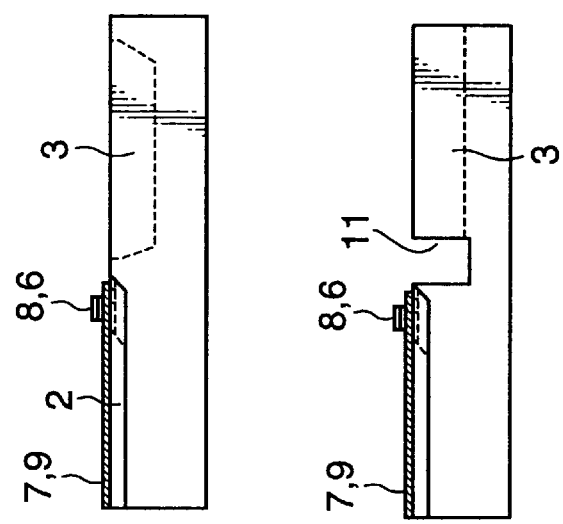
FIG. 4-B9
FIG. 4-B10
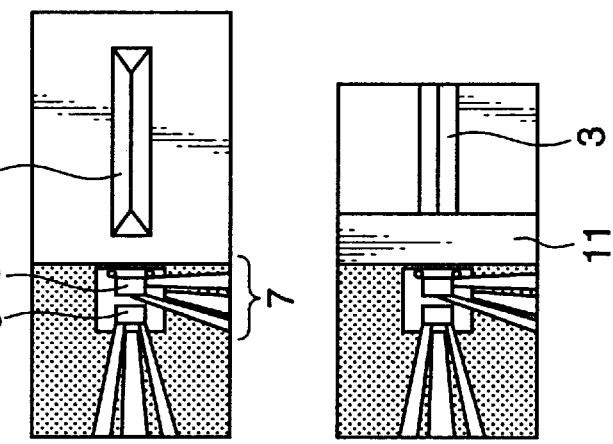
FIG. 4-A9
FIG. 4-A10

FIG.7-A1
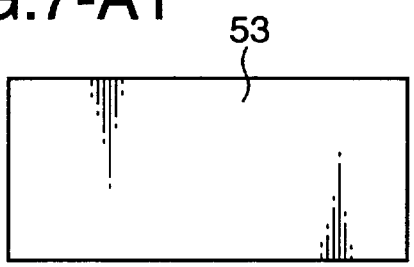
FIG.7-B1
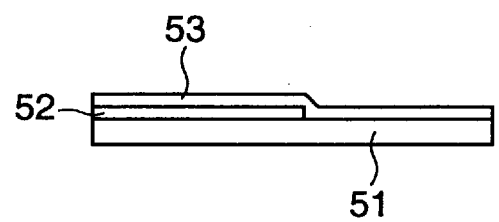
FIG.7-A2
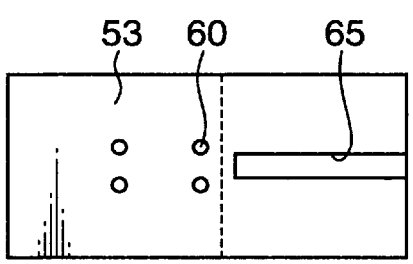
FIG.7-B2
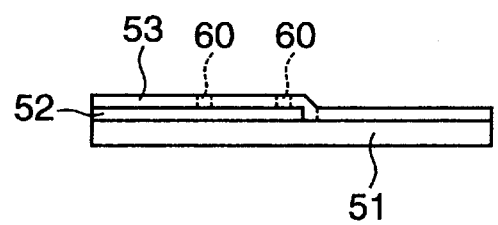
FIG.7-A3
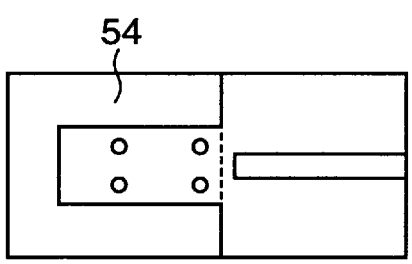
FIG.7-B3
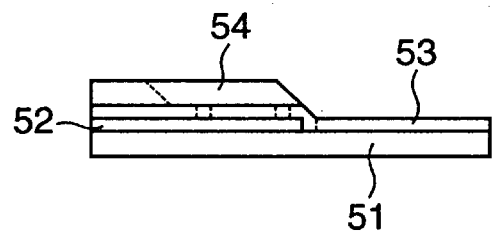
FIG.7-A4
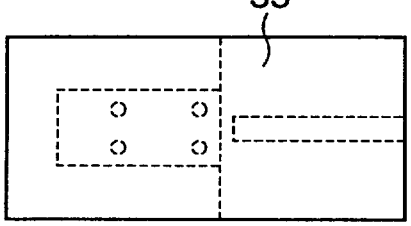
FIG.7-B4
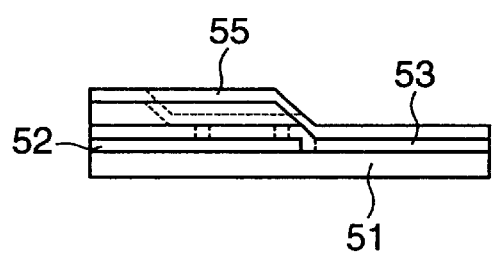

FIG.8-A5
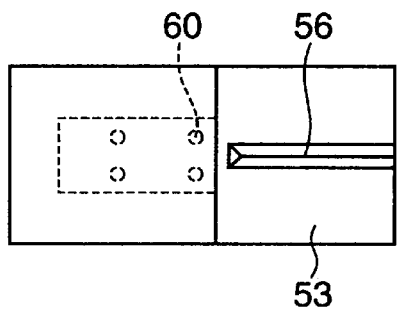
FIG.8-B5
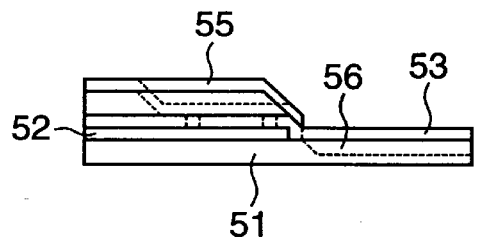
FIG.8-A6
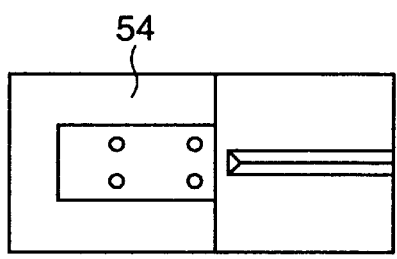
FIG.8-B6
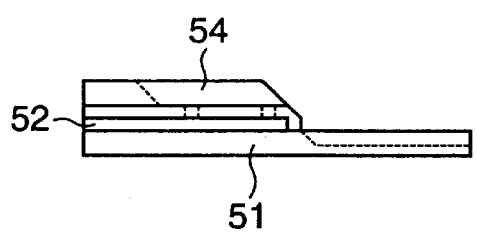
FIG.8-A7
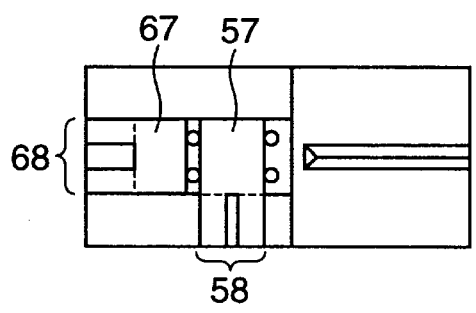
FIG.8-B7
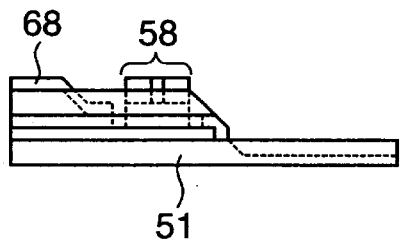
FIG.8-A8
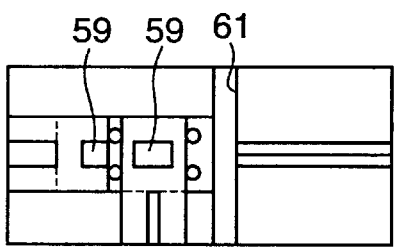
FIG.8-B8
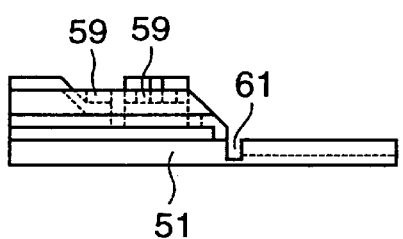

SUBSTRATE FOR MOUNTING AN OPTICAL COMPONENT AND OPTICAL MODULE PROVIDED WITH THE SAME

BACKGROUND OF THE INVENTION

This invention relates to a substrate for mounting an optical component and an optical module which are suitably used in optical transmission, optical communication and the like.

In recent years, optical fiber communication has been put into practice in the fields of CATV and public communication. Conventionally, optical modules having a high operation speed and high reliability have been realized by the so-called coaxial or dual-inline type module construction. These optical modules have been already put into practice mainly in the so-called trunk systems.

Contrary to this, optical modules have been recently vigorously developed using a technique for highly precisely positioning and mounting optical components and an optical fiber on a silicon auxiliary substrate (auxiliary mount placed in a package, also called silicon platform) only by mechanical precision. These optical modules are targeting a practical use mainly in an area called subscriber system, and are required to be smaller, thinner and less expensive. On the other hand, it has become essential for optical modules to operate in a wider band and, accordingly, there is a demand for realization of substrate for mounting an optical components which can operate in a high-frequency region.

In the substrates for mounting an optical component, which are used for these optical modules, markers used to position optical semiconductor devices on a substrate as a base member have been frequently formed simultaneously with a V-shaped groove in which an optical fiber is mounted. For example, as shown in FIG. 11, markers 102 in the form of V-shaped grooves are formed in a substrate 101 by anisotropic etching by the same mask as a V-shaped groove 103 for mounting an optical fiber, using a photolithography technique. Accordingly, a relative positioning precision of the markers 102 and the V-shaped groove 103 is determined by the precision of a photomask, and the markers 102 and the V-shaped groove 103 are hardly displaced with respect to each other. Indicated at 104 is an electrode for mounting optical semiconductor devices.

Further, it is also known to form the so-called self-alignment marker for simultaneously fabricating a pattern for forming the V-shaped groove 103, a pattern for forming electrodes 104 for mounting optical semiconductor devices and an electrode 106 for driving the optical semiconductor devices, and a pattern for forming alignment markers 105 as shown in FIG. 12.

However, if the substrates 101 shown in FIGS. 11 and 12 are made of a silicon monocrystal, a dielectric loss increases in a high-frequency region due to a large dielectric loss tangent if electrical signals for driving the optical semiconductor devices are high-frequency signals. This causes a problem of degraded characteristics of the optical module.

Further, in the case of the V-shaped groove markers 102 shown in FIG. 11, they are generally formed by anisotropic etching. Accordingly, even if the mask configuration is circular in a plane, the selective etching causes a specific rectangular configuration, consequently restricting the configuration of the markers 102. In order to increase the mounting precision, it may be considered to combine a plurality of V-shaped groove markers formed in positions surrounding the same optical semiconductor device. However, the combination of a plurality of alignment markers makes the entire arrangement area of those markers larger. Therefore, it becomes difficult to observe each alignment marker unit by enlarging it in order to increase the mounting precision.

SUMMARY OF THE INVENTION

It is an object of the present invention to provide a substrate for mounting an optical component and an optical module which are free from the problems residing in the prior art.

It is another object of the present invention to provide a substrate for mounting an optical component and an optical module which can suitably operate even if electrical signals for driving optical semiconductor devices are high-frequency signals.

It is still another object of the present invention to provide a substrate for mounting an optical component and an optical module which enable high-precision mounting of optical semiconductor devices.

According to an aspect of the invention, a substrate for mounting an optical component is provided with a base member having a semiconductor device mounting portion including a higher located first area to have an optical semiconductor device mounted on its outer surface and a second area which is stepped down from the first area so as to be located lower than the first area, an insulation layer provided in the second area of the base member so as to have substantially the same height as the first area and having a smaller dielectric loss tangent than the base member, and a driving electrode pattern provided on the insulation layer for driving the optical semiconductor device.

According to another aspect of the invention, an optical module is provided with a base member including a semiconductor device mounting portion having a higher located first area to have an optical semiconductor device mounted on its outer surface and a second area which is stepped down from the first area so as to be located lower than the first area, and a waveguide mounting portion where a optical waveguide to be optically coupled to the optical semiconductor device is to be mounted, an insulation layer provided in the second area of the base member so as to have substantially the same height as the first area and having a smaller dielectric loss tangent than the base member, a driving electrode pattern provided on the insulation layer for driving the optical semiconductor device. Further, there are provided an optical semiconductor device mounted in the first area of the semiconductor device mounting portion and an optical waveguide mounted in the waveguide mounting portion to be optically coupled to the optical semiconductor device.

With the above constructions, since the insulation layer provided in the second area of the base member has a smaller dielectric loss tangent than the base member, the loss in the driving electrode pattern provided on the insulation layer can be small even if a drive signal fed to the optical semiconductor device is a high-frequency signal. Therefore, a substrate for mounting an optical component having excellent electrical performance and reliability can be realized. Further, alignment markers for positioning the optical semiconductor device during mounting on the base member can be easily formed in the first area. If such alignment markers are formed in the first area, the optical semiconductor device can be highly precisely mounted. In this respect as well, a substrate for mounting an optical component and an optical module having excellent electrical performance and reliability can be realized.

According to still another aspect of the invention, a substrate for mounting an optical component is provided with a base member having a semiconductor device mounting portion where an optical semiconductor device is to be mounted and a waveguide mounting portion formed with a groove for mounting an optical waveguide to be optically coupled to the optical semiconductor device; a first insulation film formed on an outer surface of the semiconductor device mounting portion of the base member, a second insulation film which is so formed on an outer surface of the semiconductor device mounting portion of the base member as to expose at least a portion of the first insulation film and is thicker than the first insulation film, a mounting electrode pattern for mounting the optical semiconductor device which pattern is formed to extend over the first insulation film, and a driving electrode pattern for driving the optical semiconductor device which pattern is formed to extend over the second insulation film.

According to further aspect of the invention, an optical module is provided with a base member having a semiconductor device mounting portion where an optical semiconductor device is to be mounted and a waveguide mounting portion formed with a groove for mounting an optical waveguide to be optically coupled to the optical semiconductor device, a first insulation film formed on an outer surface of the semiconductor device mounting portion of the base member, a second insulation film which is so formed on an outer surface of the semiconductor device mounting portion of the base member as to expose at least a portion of the first insulation film and is thicker than the first insulation film, a semiconductor device alignment marker formed in the first insulation film and positioned with respect to the waveguide mounting groove, a mounting electrode pattern for mounting the optical semiconductor device which pattern is formed to extend over the first insulation film, a driving electrode pattern for driving the optical semiconductor device which pattern is formed to extend over the second insulation film, an optical waveguide mounted in the waveguide mounting groove, and an optical semiconductor device is mounted on the mounting electrode pattern formed over the first insulation film to be optically coupled to the optical waveguide.

With these constructions, since the driving electrode pattern is provided on the second insulation film formed in the semiconductor device mounting portion of the base member, the loss in the driving electrode patterns provided on the second insulation film can be small even if a drive signal fed to the optical semiconductor device is a high-frequency signal. Therefore, a substrate for mounting an optical component having excellent electrical performance and reliability can be realized. Further, alignment markers for positioning the optical semiconductor device during mounting on the base member can be easily formed in the first area. If such alignment markers are formed in the first area, the optical semiconductor devices can be highly precisely mounted. In this respect as well, a substrate for mounting an optical component and an optical module having excellent electrical performance and reliability can be realized.

These and other objects, features and advantages of the present invention will become more apparent upon a reading of the following detailed description and accompanying drawings.

BRIEF DESCRIPTION OF THE DRAWINGS

FIGS. 1A and 1B are diagrams showing a substrate for mounting optical components according to a first embodiment of the invention, FIG. 1A being a plan view, and FIG. 1B being a sectional view taken along the line 1B—1B in FIG. 1A;

FIGS. 2-A1 to 2-A3 and 2-B1 to 2-B4 are diagrams showing an exemplary fabrication process of the substrate shown in FIGS. 1A and 1B, FIGS. 2-A1 to 2-A3 being plan views, and FIGS. 2-B1 to 2-B4 being side views:

FIGS. 3-A5 to 3-A8 and 3-B5 to 3-B8 are diagrams showing another exemplary fabrication process of the substrate shown in FIGS. 1A and 1B, FIGS. 3-A5 to 3-A8 being plan views, and FIGS. 3-B5 to 3-B8 being side views;

FIGS. 4-A9 to 4-A10 and 4-B9 to 4-B10 are diagrams showing still another exemplary fabrication process of the substrate shown in FIGS. 1A and 1B, FIGS. 4-A9 and 4-A10 being plan views, and FIGS. 4-B9 and 4-B10 being side views;

FIGS. 7-A1 to 7-A4 and 7-B1 to 7-B4 are diagrams showing an exemplary fabrication process of the substrate shown in FIG. 6, FIGS. 7-A1 to 7-A4 being plan views, and FIGS. 7-B1 to 7-B4 being side views;

FIGS. 8-A5 to 8-A8 and 8-B5 to 8-B8 are diagrams showing another exemplary fabrication process of the substrate shown in FIG. 6, FIGS. 8-A5 to 8-A8 being plan views and FIGS. 8-B5 to 8-B8 being side views;

DETAILED DESCRIPTION OF THE PREFERRED EMBODIMENTS OF THE INVENTION

Figure 5:
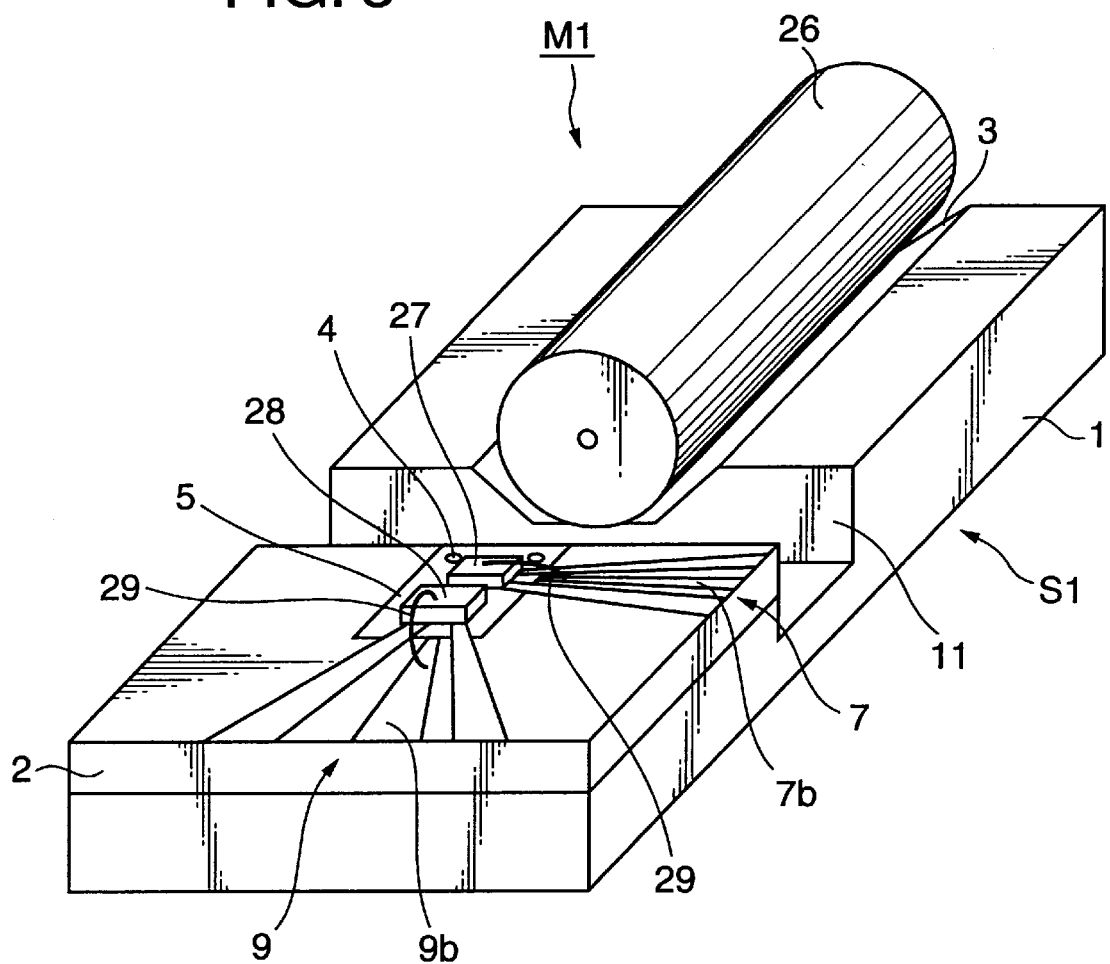
FIG. 5 is a perspective view showing an optical module provided with the substrate shown in FIGS. 1A and 1B.

FIGS. 1A and 1B are diagrams showing a substrate S1 for mounting optical components according to a first embodiment of the invention, wherein FIG. 1A is a plan view and FIG. 1B is a sectional view taken along the line 1B—1B in FIG. 1A. As shown in FIGS. 1A and 1B, optical semiconductor devices (not shown) such as a semiconductor laser or like light emitter and a light detector for monitoring the light emitter are mounted on an upper portion (first area) $1a$ of a stepped substrate (base member) 1. An insulation film (insulation layer) 2 having a smaller dielectric loss tangent than the substrate 1 is so provided on a lower portion $1b$ of the substrate 1 as to have the same height as the upper portion $1a$, and an insulation film (insulation layer) 5 thinner than the insulation film 2 is provided on the upper portion $1a$. Driving conductor patterns 7, 9 to be connected with the optical semiconductor devices are provided on these insulation films 2, 5.

The step defining the lower portion $1b$ is highly precisely formed by anisotropic etching if the substrate 1 is made of a silicon monocrystal to which anisotropic etching can be applied. The optical semiconductor devices are positioned on the substrate 1 by alignment markers (positioning markers in the form of openings) made of openings formed in the inner insulation film 5.

More specifically, on the substrate 1 made of a silicon monocrystal and having principal planes in a specified direction (for example, (100) planes) are formed: the insulation film 2 on a stepped area (second area) which is so processed as to be deeper than one principal plane by a specified distance, a V-shaped groove 3 in which an optical fiber as an optical waveguide is mounted, the alignment markers 4 (these alignment markers 4 are formed in the insulation film 5) positioned with respect to the V-shaped groove 3, the insulation film 5 formed on an area (first area) of the upper surface of the substrate 1 except the stepped area, and conductor patterns 6, 7a to 7c, 8 and 9a to 9c for driving the optical semiconductor device to be mounted using the alignment markers 4 (6: electrode pattern for mounting a light emitter, 7a to 7c: electrode patterns for driving the light emitter, 8: electrode pattern for mounting a light detector for monitoring, 9a to 9c: electrode pattern for driving the light detector for monitoring). These driving conductor patterns are provided on the outer surface of the insulation film 2 formed in the stepped area of the upper surface of the substrate 1 and on the outer surface of the insulation film 5 formed in the area of the upper surface of the substrate 1 except the stepped area. Indicated at 10 in FIGS. 1A and 1B are solder patterns formed on the mounting electrode patterns 6 and 8.

A semiconductor device mounting portion is comprised of the first and second areas of the substrate 1. The substrate 1 also has a waveguide mounting portion adjacent to the semiconductor device mounting portion, and the V-shaped groove 3 in which the optical fiber is to be mounted is formed in this waveguide mounting portion.

The insulation film 2 is so formed as to have a thickness of 1 $\mu$m or larger. After the insulation film 2 is formed in the stepped area, the openings defining the alignment markers 4 and a pattern defining the V-shaped groove 3 are simultaneously formed. The insulation film 2 is partially formed on the outer surface of the substrate 1. This is because formation of insulation film on the entire surface of the substrate 1 is likely to cause an excessive stress in the substrate 1 and the formed insulation film, deformation of the substrate 1, crack in the formed insulation film, and other disadvantageous effects. To make the outer surface of the partially formed insulation film 2 flush with the outer surface of the substrate 1, also, etching is carried out to form the stepped space for the insulation film 2 in the substrate 1.

Specifically, the area where the insulation film 2 is formed is processed to have a depth equal to or larger than 1/1000 of the thickness of the substrate 1 from the one principal plane of the substrate 1, and the insulation film 2 having a thickness equal to or larger than 1/1000 of the thickness of the substrate 1 is formed, so that the one principal plane of the substrate 1 and the outer surface of the insulation film 2 lie in the same plane. For example, if the depth of the stepped area is less than 1 $\mu$m in the substrate having a thickness of 1 mm, the thickness of the insulation film 2 is less than 1 $\mu$m, and an electric field is absorbed by the substrate, resulting in a large dielectric loss. If the depth of the stepped area is 500 $\mu$m or larger (½ or larger than the thickness of the substrate), the substrate becomes fragile and easily breakable. Thus, the thickness of the insulation film 2 is preferably between 5 $\mu$m and 300 $\mu$m, more preferably between 10 $\mu$m and 60 $\mu$m. A warp of the substrate was 3 $\mu$m or smaller when the depth of the stepped area was 5 $\mu$m, whereas it was 70 $\mu$m or smaller when this depth was 100 $\mu$m. Further, since the one principal plane of the substrate 1 is flat, a degree of freedom in designing an electrode arrangement increases and impedance matching can be easily performed, with the result that reflection waves in a high-frequency region can be almost eliminated.

Next, a method for fabricating the substrate S1 is described. As shown in FIGS. 2-A1 to 2-A3, 2-B1 to 2-B4, in order to first form the stepped area L where the insulation film having a depth of 1 $\mu$m or larger by etching the upper surface of the substrate 1, a pattern is formed by a photomask for forming the insulation film forming area. The upper surface of the substrate 1 is removed by isotropic etching or anisotropic etching to form this area L.

Thereafter, the insulation film 2 having a thickness equal to or larger than the step is formed in the etched area L by a plasma CVD method or spattering method. Next, the area L where the insulation film 2 has been formed is processed by a super-precision surface abrasion method such that the insulation film 2 has the same height as the one principal plane of the substrate 1, i.e. the one principal plane of the substrate and the upper surface of the insulation film 2 lie in the same plane.

Next, as shown in FIGS. 3-A5 to 3-A8 and 3-B5 to 3-B8, thermal oxidation is applied to the upper surface of the substrate 1 to form a thermally oxidized film as the insulation film 5 on the entire upper surface of the substrate 1 except the stepped area L. Thereafter, the thermally oxidized film is removed in the optical fiber mounting portion, thereby leaving the thermally oxidized film only in the semiconductor device mounting portion. Then, a silicon nitride film 23 is formed on the entire upper surface of the substrate 1. A pattern 24 for defining the V-shaped groove in the optical fiber mounting portion and a pattern 25 for forming the alignment markers for the optical semiconductor device in the semiconductor device mounting portion (first area) are then formed in the same photomask. Using this photomask, the silicon nitride film is removed only in the areas where these patterns are formed. In this way, the alignment markers 4 in the form of openings which are highly precisely positioned with respect to the V-shaped groove where the optical fiber is mounted are formed in the semiconductor device mounting portion.

Next, the driving electrode patterns 7, 9 for the optical semiconductor device are formed on the insulation film 2. A protection film made of the silicon nitride film 23 is then formed on the entire upper surface of the substrate 1. The thick insulation film 2 is formed such that its upper surface is located at the same height as the upper surface of the substrate 1, i.e. the upper surface of the insulation film 2 and the upper surface of the substrate 1 form a flat surface having no step. As a result, the protection film made of the silicon nitride film 23 can be formed without being interrupted at edge portions of the insulation film 2 and the like.

Next, the protection film made of the silicon nitride film 23 in the optical fiber mounting portion is removed while only leaving the silicon nitride film formed at first, thereby exposing the pattern 24 for forming the V-shaped groove.

Using the pattern 24 formed in the silicon nitride film 23 formed at first as a silicon etching mask, the V-shaped groove 3 for mounting the optical fiber is precisely formed by anisotropic etching by an alkaline solution such as potassium hydroxide (KOH), sodium hydroxide (NaOH) or tetramethylammonium hydroxide (TMAH). By protecting the alignment markers 4 by the protection film while the V-shaped groove 3 is being formed, etching of the silicon below the alignment markers 4 can be prevented to thereby maintain the shape of the alignment markers. As a result, the alignment markers 4 can be formed to have such a complicated shape as to improve the mounting precision of the optical semiconductor devices. The alignment markers 4 may have a circular shape or a ring-shape. The markers may also take various other shapes if necessary.

Next, the silicon nitride film 23 in the optical fiber mounting portion and that in the semiconductor device mounting portion are removed. At this time, the silicon nitride film 23 formed at first in the semiconductor device mounting portion is not removed.

Thereafter, as shown in FIGS. 4-A9 to 4-A10 and 4-B9 to 4-B10, the mounting electrode patterns 6, 8 and the driving electrode patterns 7, 9 for the optical semiconductor devices are formed in the semiconductor device mounting portion, and solders (solder patterns) 10 for securing the optical semiconductor devices are formed on the mounting electrode patterns 6, 8. The mounting electrodes 6, 8 are to be connected with the driving electrode patterns 7, 9 formed previously on the thick insulation film 2. Finally, a rectangular groove 11 for stopping the optical fiber is formed.

Next, an optical module according to an embodiment of the invention is described. As shown in FIG. 5, an optical module M1 is constructed as follows. An optical fiber 26 is mounted in the V-shaped groove 3 of the substrate S1 obtained by the above fabrication method, a light emitter 27 is provided via the solder pattern 10 on the mounting electrode pattern 6 which is a driving conductor pattern formed on the insulation film 5, a light detector 28 for monitoring is provided via the solder pattern 10 on the mounting electrode pattern 8, and these optical semiconductor devices are connected to driving electrode patterns 7b, 9b formed on the thick insulation film 2 via bonding wires 29. In this way, the optical module M1 is constructed to enable optical coupling between the light emitter 27 and an end of the optical fiber 26.

Example 1

A specific example of the fabrication method for the substrate S1 is described.

First, a pattern for providing a stepped area having a depth of 5 μm using photolithography was formed in a portion of the upper surface of a substrate made of a silicon monocrystal corresponding to an area where electrodes for driving the optical semiconductor device were to be formed, and the stepped area was formed in the surface of the silicon substrate by anisotropic etching using a KOH solution (concentration: 43% by weight, temperature: 63.5° C.).

Subsequently, a TEOS (tetraethoxy ortho-silane) having a thickness of 6 μm was formed as an insulation film only in the stepped area by a plasma CVD method. In order to make the upper surface of the TEOS film at the same height as the upper surface of the silicon substrate, the entire upper surface of the substrate was precisely abraded to reduce the thickness of the TEOS film to 5 μm to be leveled with the upper surface of the substrate. Next, thermal oxidation was applied to form a thermally oxidized film having a thickness of 0.1 μm on the upper surface of the silicon substrate. After the thermally oxidized film was removed at and near a portion where the V-shaped groove for mounting the optical fiber was to be formed, a silicon nitride film having a thickness of 0.1 μm was formed on the entire upper surface of the substrate to form a V-shaped groove pattern and an alignment marker pattern. Alignment markers were formed in an area of the upper surface of the silicon substrate where the thermally oxidized film was provided.

Next, a silicon nitride film having a thickness of 0.1 μm was formed as a protection film on the entire upper surface of the substrate, and the silicon nitride film at and near the V-shaped groove pattern was removed by the thickness of 0.1 μm of the protection film. Subsequently, anisotropic etching was applied by immersing this silicon substrate in a KOH solution (concentration: 43% by weight, temperature: 63.5° C.) using the remaining silicon nitride film (this silicon nitride film was formed with the V-shaped groove pattern) as an etching mask, thereby forming the V-shaped groove for mounting the optical fiber. Then, the silicon nitride film as the protection film on the driving electrode patterns previously formed on the insulation film and the silicon nitride film serving as the etching mask for forming the V-shaped groove were removed. Mounting and driving electrode patterns for the optical semiconductor device were then formed by providing layers of Ti, Pt, Au respectively having thicknesses of 0.1 μm, 0.3 μm, 0.3 μm one after another. Ti, Pt, Au layers were lower, middle and upper layers, respectively.

Thereafter, solder (containing 70% by weight of Au and 30% by weight of Sn (thickness of about 3 μm)) was provided on the mounting electrode patterns for the optical semiconductor devices. Finally, a rectangular groove for stopping the optical fiber was formed by machining such as dicing, and ends of the substrate were cut off.

Example 2

An example of the optical module M1 using the substrate S1 is described.

As shown in FIG. 5, the optical fiber 26 is mounted in the V-shaped groove 3 formed by etching in the substrate S1, the light emitter 27 and the light detector 28 for monitoring are provided via the solder patterns (not shown) on the mounting electrode patterns (not shown) which are driving conductor pattern formed on the insulation film 5, respectively, by being aligned using the alignment markers 4, and these optical semiconductor devices 27, 28 are connected to the driving electrode patterns 7b, 9b via the bonding wires 29. This enables optical coupling between the light emitter 27 and an end of the optical fiber 26.

In this way, the optical module M1 capable of precisely realizing optical coupling only by mounting the optical semiconductor device 27 such as a semiconductor laser on the mounting electrode pattern 6 on the substrate 1, i.e. realizing the so-called passive alignment is completed. It should be noted that the optical module M1 may be entirely molded by a resin after mounting a lid (not shown) or without mounting a lid. Instead of the semiconductor laser, a LED (light-emitting diode) or the like may be used as the light emitter 27. Further, a PD (photodiode) or the like may be used as the light detector 28. Alternatively, only the light emitter 27 may be used without using the light detector 28 or only the light detector 28 may be used without using the light emitter 27.

According to the thus constructed substrate S1 for mounting optical components and optical module M1, the thick insulation layer having a smaller dielectric loss tangent than the substrate can be formed, and an electric field is unlikely to be absorbed by the substrate when the optical semiconductor devices are driven in a high-frequency region by forming the driving electrode patterns for the optical semiconductor devices on this insulation layer, thereby preventing a dielectric loss from increasing. Further, the driving electrode patterns can be continuously formed without interruption since there is no step between the thick insulation layer and the thermally oxidized film (insulation layer) on the upper surface of the substrate.

Since the thick insulation layer is provided, stresses which act on the substrate and the insulation layer can be alleviated, thereby preventing the occurrence of an undesirable event where the substrate is deformed or the insulation layer is cracked. Further, since there is no step between the thick insulation layer and the insulation layer on the upper surface of the substrate, the driving electrode patterns are free from partial peeling, which reduces the probability of disconnection error. Furthermore, provision of an earth electrode on the substrate enables impedance matching with the signal source side, which can maximally prevent deterioration of the waveform of a signal due to a reflection wave in the high-frequency region.

Further, since the alignment marker pattern and the V-shaped groove pattern can be formed by the same photomask, it is easier to form such complicated markers as to provide an improved mounting precision of the optical semiconductor devices, the alignment markers and the V-shaped groove can be highly precisely positioned with respect to each other, and the alignment markers can be more satisfactorily observed. With these advantages, an optical module having a high optical coupling efficiency between the optical semiconductor device and an optical waveguide can be provided.

Figure 6:
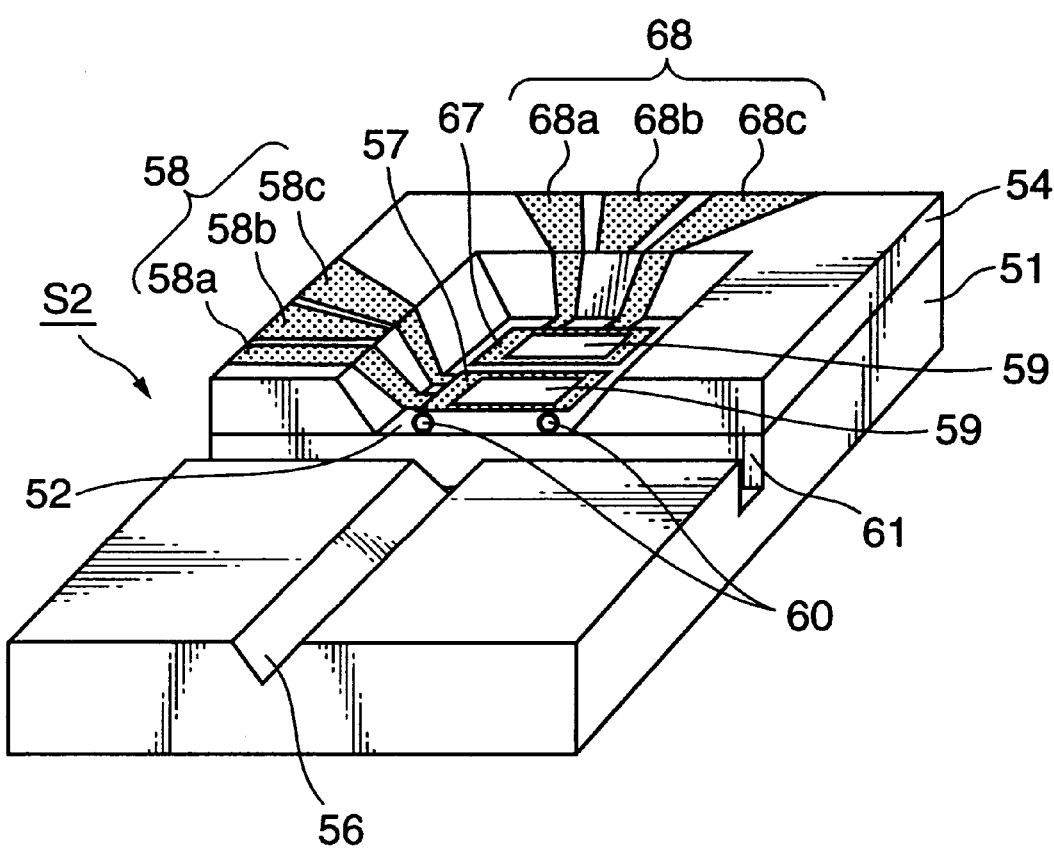
FIG. 6 is a perspective view showing a substrate for mounting optical components according to a second embodiment of the invention.

FIG. 6 shows a substrate S2 for mounting optical components according to a second embodiment of the invention. As shown in FIG. 6, in the mounting substrate S2, a V-shaped groove 56 in which an optical fiber as an optical waveguide to be described later is mounted, alignment markers 60 positioned with respect to the V-shaped groove 56, driving conductor patterns 57, 58a to 58, 67, 68a to 68c for optical semiconductor devices to be mounted using the alignment markers 60 (57: electrode pattern for mounting a light emitter, 58a to 58c: electrode patterns for driving the light emitter, 67: electrode pattern for mounting a light detector for monitoring, 68a to 68c: electrode patterns for driving the light detector for monitoring) are formed on a substrate 51 made of a silicon monocrystal and having principal planes in a specified direction. Indicated at 59 in FIG. 6 are solder patterns formed on the mounting electrode patterns 57 and 67.

Among the driving conductor patterns, the driving electrode patterns 58, 68 are formed both on a first insulting film 52 formed on the substrate 51 and on a second insulation film 54 which is thicker than the first insulation film 52. The alignment markers 60 in the form of openings are formed in the first insulation film 52.

The first insulation film 52 is formed to have a very small thickness of in the order of 100 Å to in the order of 1000 Å, so that heat produced in the optical semiconductor devices can be easily released. While this thin film is formed, patterns for forming the openings forming the alignment markers 60 and the V-shaped groove 56 are simultaneously formed. The second insulation film 54 is formed to have a thickness of about 5 $\mu$m to 10 $\mu$m, so that it is thicker than the first insulation film 52. This is because an electric field is absorbed by the substrate to increase the loss when the optical semiconductor devices are driven in a high-frequency region if the second insulation film 54 is thinner than 5 $\mu$m, whereas it is difficult to form slanted surfaces to be described later if the second insulation film 54 is thicker than 10 $\mu$m.

A semiconductor device mounting portion is comprised of an area (first area) of the substrate where the first insulation film 52 is formed and an area (second area) thereof where the second insulation film 54 is formed. The substrate 51 also has a waveguide mounting portion adjacent to the semiconductor device mounting portion, and the V-shaped groove 56 in which the optical fiber is mounted is formed in this waveguide mounting portion.

Next, a method for fabricating this substrate S2 is described with reference to FIGS. 7-A1 to 7-A4, 7-B1 to 7-B4, 8-A5 to 8-A8, and 8-B5 to 8-B8.

First, thermal oxidation is applied to the upper surface of the substrate 51 to form a thermally oxidized film on the entire upper surface. Thereafter, as shown in FIGS. 7-A1 and 7-B1, the thermally oxidized film in the optical fiber mounting portion is removed to leave it only in the optical semiconductor device mounting portion, thereby forming the first insulation film 52. A silicon nitride film 53 is then formed on the entire upper surface of the substrate 51.

Next, as shown in FIGS. 7-A2 and 7-B2, a pattern for forming the V-shaped groove 56 in the optical fiber mounting portion and a pattern 65 for defining the alignment markers 60 in the semiconductor device mounting portion are formed in the same photomask. Using this photomask, the silicon nitride film 53 is removed only in the areas where the V-shaped groove pattern and the marker pattern are formed. In this way, there are formed the alignment markers 60 in the form of openings and the V-shaped groove pattern 65 which are highly precisely positioned with respect to each other.

Next, as shown in FIGS. 7-A3, 7-B3, after a thick insulation film is formed on the entire upper surface of the substrate 51, the thick insulation film 54 is formed only in an area surrounding the semiconductor device mounting portion by removing an unnecessary portion of the formed insulation film by means of isotropic etching. Both the first and second insulation films 52 and 54 have a smaller dielectric loss tangent than the substrate 51.

Next, as shown in FIGS. 7-A4 and 7-B4, a protection film 55 which is a silicon nitride film is formed on the entire upper surface of the substrate 51. Since the second insulation film 54 is formed by isotropic etching, edge portions thereof excluding an outer peripheral portion of the substrate 51 are slantingly formed. As a result, the protection film 55 can be continuously formed without being interrupted at the edge portions of the thick second insulation film 54.

Next, as shown in FIGS. 8-A5 and 8-B5, the protection film 55 in the optical fiber mounting portion is removed while leaving the silicon nitride film 53 formed at first, thereby exposing the V-shaped groove pattern 65 formed in the step of FIGS. 7-A2 and 7-B2. Using the exposed pattern 65 made of the silicon nitride film 53 as an etching mask, the V-shaped groove 56 is precisely formed by anisotropic etching using an alkaline solution such as a potassium hydroxide (KOH) solution.

By protecting the alignment markers 60 by the protection film 55 when the V-shaped groove 56 is formed, etching of the silicon below the alignment markers 60 can be prevented to thereby maintain the shape of the alignment markers. As a result, the alignment markers 60 can be formed to have such a complicated shape as to improve the mounting precision of the optical semiconductor devices.

Next, as shown in FIGS. 8-A6 and 8-B6, the silicon nitride film 53 in the optical fiber mount portion (waveguide mounting portion) and the silicon nitride film 55 in the semiconductor device mounting side are removed. At this time, the silicon nitride film 53 in the area where the semiconductor devices are to be mounted (i.e. in the aforementioned first area) is not removed.

Next, as shown in FIGS. 8-A7 and 8-B7, the mounting electrode patterns 57, 67 are formed on the semiconductor device mounting portion, and the driving electrode patterns 58, 68 are formed on the semiconductor device mounting portion and the second insulation film 54.

Thereafter, as shown in FIGS. 8-A8 and 8-B8, the solder patterns 59 for securing the optical semiconductor devices on the mounting electrode patterns 57, 67 are formed. It should be noted that the driving electrode patterns 58, 68 are formed on the second and first insulation films 54, 52 as described above, and are connected to the mounting electrode patterns 57, 67. Finally, a rectangular groove 61 for stopping the optical fiber is formed.

Figure 9A:
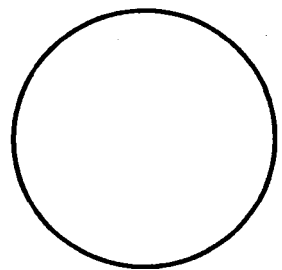
FIGS. 9A to 9F are plan views showing specific shapes of alignment markers in the substrate shown in FIG. 6.
Figure 9B:
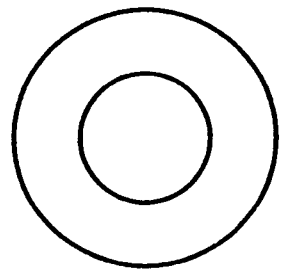
Figure 9C:
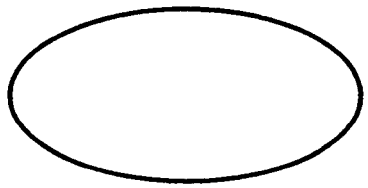
Figure 9D:
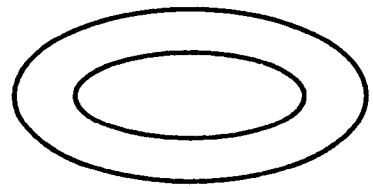
Figure 9E:
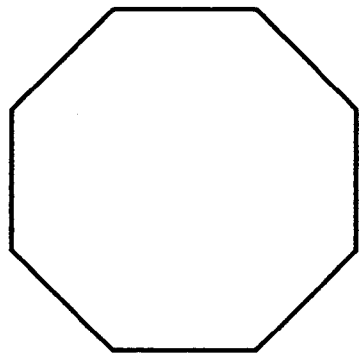
Figure 9F:
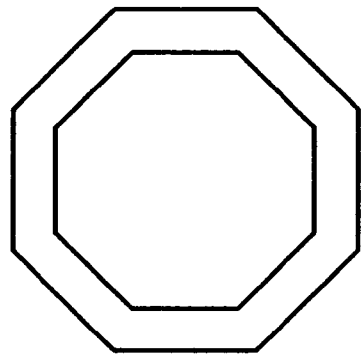

Examples of the shape of the alignment markers 60 are described with reference to FIGS. 9A to 9F. The alignment markers 60 may have a circular shape as shown in FIG. 9A or a ring-shape as shown in FIG. 9B. However, in order to maximally prevent the angular displacement, they may have an elliptical shape as shown in FIG. 9C, an elliptical ring-shape as shown in FIG. 9D, a polygonal shape such as an octagonal shape as shown in FIG. 9E or a polygonal ring-shape as shown in FIG. 9F.

Figure 10:
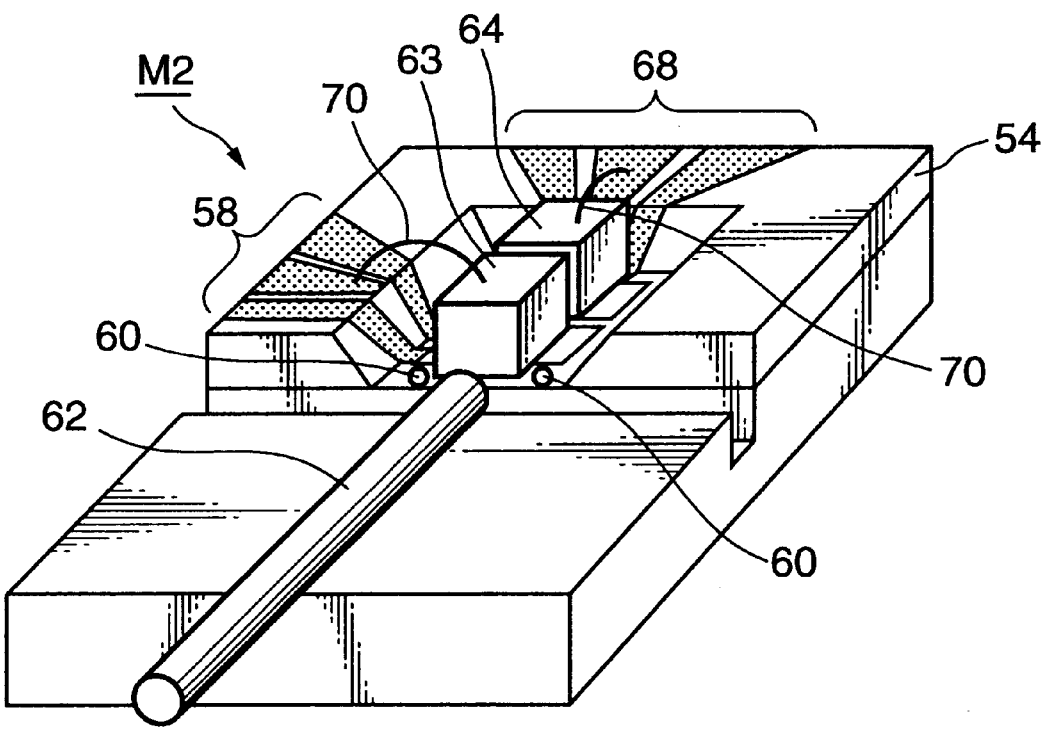
FIG. 10 is a perspective view showing an optical module provided with the substrate shown in FIG. 6.
Figure 11:
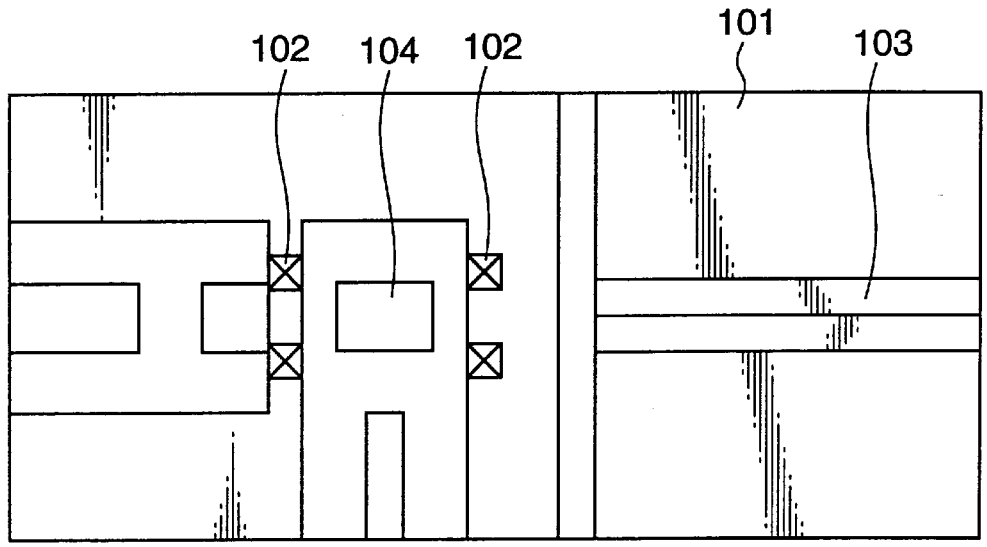
FIG. 11 is a plan view showing a conventional substrate for mounting an optical component.
Figure 12:
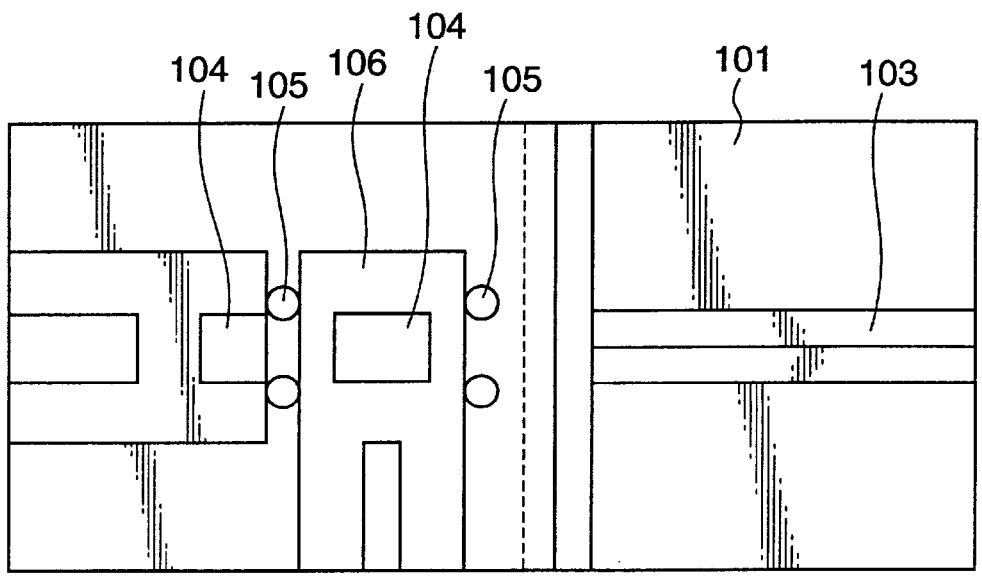
FIG. 12 is a plan view showing another conventional substrate for mounting an optical component.

Next, an optical module according to the second embodiment of the invention is described. As shown in FIG. 10, an optical module M2 is constructed such that, an optical fiber 62 is mounted in the V-shaped groove 56 of the substrate S2 obtained by the above fabrication method, a light emitter 63 is provided on the mounting electrode pattern 57 formed on the first insulation film 52 via the solder pattern 59, a light detector 64 for monitoring is provided on the mounting electrode pattern 67 via the solder pattern 59, and these optical semiconductor devices are connected to driving electrode patterns 58b, 68b via bonding wires 70. In this way, the optical module M2 is constructed to enable optical coupling between the light emitter 63 and an end of the optical fiber 62.

Example 3

An example of the fabrication method for the substrate S2 is described. First, a thermally oxidized film (silicon oxide film) having a thickness of 1 μm was formed on a substrate made of a silicon monocrystal. Then, this thermally oxidized film was removed at and around where a V-shaped groove for mounting an optical fiber was to be formed. A silicon nitride film was then formed on the entire upper surface of the substrate to have a thickness of 0.5 μm, thereby forming a V-shaped groove pattern and an alignment marker pattern. Alignment markers were formed where the thermally oxidized film was not removed. A silicon oxide film having a thickness of 10 μm was formed as an insulation film on the portion of the substrate that corresponds to the semiconductor device mounting portion. Thereafter, isotropic etching was carried out to form the recessed space for accommodating optical semiconductor devices.

Next, a silicon nitride film was formed on the entire upper surface of the substrate as a protection film to have a thickness of 0.5 μm, and the silicon nitride film at and near the V-shaped groove pattern was removed by the thickness of 0.5 μm of the protection film. Subsequently, anisotropic etching was applied by immersing this silicon substrate in a KOH solution (concentration: 43% by weight, temperature: 60° C.) using the V-shaped groove pattern formed in the silicon nitride film formed at first as an etching mask, thereby forming the V-shaped groove for mounting the optical fiber. Then, the silicon nitride film as the protection film formed on and around the mounting and driving electrode patterns for the optical semiconductor devices and the silicon nitride film serving as the etching mask for forming the V-shaped groove were removed. The mounting and driving electrode patterns for the optical semiconductor devices were then formed by providing layers of Ti, Pt. Au respectively having thicknesses of 1000 Å, 2000 Å, 2000 Å one after another. Solder (containing 80% by weight of Au and 20% by weight of Sn (thickness of about 3 μm)) was provided on the mounting electrodes 58. Finally, a rectangular groove for stopping the optical fiber is formed by machining.

It should be noted that the optical module M2 according to the second embodiment may be entirely molded by a resin after mounting a lid (not shown) or without mounting a lid. Instead of the semiconductor laser, a LED (light-emitting diode) or the like may be used as the light emitter 63. Further, a PD (photodiode) or the like may be used as the light detector 64. Alternatively, only the light emitter 63 may be used without using the light detector 64 or only the light detector 64 may be used without using the light emitter 63.

According to the thus constructed substrate S2 and optical module M2 according to the second embodiment, a high-frequency electric field is unlikely to be absorbed due to the presence of the thick second insulation film 54 when the optical semiconductor devices are driven in a high-frequency region, with the result that the loss can be maximally reduced. Further, since the driving conductor patterns 58, 68 are formed both on the first insulting film 52 formed on the substrate 51 and on the second insulation film 54 which is thicker than the first insulation film 52, electric signals for driving the optical semiconductor devices can be designed to lie in a high-frequency region.

Further, since the alignment marker pattern and the V-shaped groove pattern can be formed by the same photomask, they can be highly precisely positioned with respect to each other, and such complicated alignment markers as to improve a mounting precision of the optical semiconductor devices can be easily formed. With these advantages, an optical module having a high optical coupling efficiency between the optical semiconductor device and the optical waveguide can be provided.

As described above, a first inventive substrate for mounting an optical component comprises a base member having semiconductor devices mounting portion comprised of a higher located first area to have optical semiconductor devices mounted on its outer surface and a second area which is stepped down from the first area so as to be located lower than the first area; an insulation layer provided in the second area of the base member so as to have substantially the same height as the first area and having a smaller dielectric loss tangent than the base member; and driving electrode patterns provided on the insulation layer for driving the optical semiconductor devices.

In this mounting substrate, since the insulation layer provided in the second area of the base member has a smaller dielectric loss tangent than the base member, the loss in the driving electrode patterns provided on the insulation layer can be small even if drive signals fed to the optical semiconductor devices are high-frequency signals. Therefore, a substrate for mounting an optical component having excellent electrical performance and reliability can be realized.

The optical semiconductor devices may be mounted in the first area of the base member.

With such a construction, the optical module can be constructed only by providing an optical waveguide since the optical semiconductor devices are mounted in the first area of the base member beforehand. As a result, the construction of the optical module can be simplified.

In the first substrate for mounting an optical component, mounting electrode patterns may be formed in the first area of the base member and the optical semiconductor devices may be mounted in the first area by being electrically connected with the mounting electrode patterns.

With such a construction, the optical semiconductor devices can be securely mounted on the base member since being mounted in the first area by being electrically connected with the mounting electrode patterns.

Further, in the substrate for mounting an optical component, solder patterns may be formed on the mounting electrode patterns in the first area, and the optical semiconductor devices may be electrically connected to the mounting electrode patterns via the solder patterns.

With such a construction, the optical semiconductor devices can be securely mounted on the base- member since being connected to the mounting electrode patterns via the solder patterns.

Further, in the first substrate for mounting an optical component, the base member may further have a waveguide mounting portion where the optical waveguide to be optically coupled with the optical semiconductor devices mounted in the semiconductor device mounting portion is to be mounted With such a construction, since the base member has the waveguide mounting portion, the optical waveguide can be securely mounted on the base member while being optically coupled to the optical semiconductor devices.

Further, in the substrate for mounting an optical component, a guide for mounting the optical waveguide may be formed in the outer surface of the waveguide mounting portion.

With such a construction, the optical waveguide can be precisely optically coupled to the optical semiconductor devices by mounting the optical waveguide in the groove formed in the waveguide mounting portion.

Further, in the substrate for mounting an optical component, the groove for stopping the optical waveguide may be formed between the semiconductor device mounting portion and the waveguide mounting portion of the base member.

With such a construction, the leading end of the optical waveguide mounted in the groove formed in the waveguide mounting portion can be precisely positioned by the optical waveguide stopping groove.

Further, in the substrate for mounting an optical component, the step may be formed by applying anisotropic etching to the base member.

The step can be securely formed in a specified position of the base member.

Further, in the substrate for mounting an optical component, the insulation layer may be provided in the first area of the base member and alignment markers in the form of openings for positioning the optical semiconductor devices being mounted may be formed in a portion of the insulation layer.

With such a construction, the optical semiconductor devices can be highly precisely positioned in the first area based on the alignment markers, with the result that a substrate for mounting an optical component having excellent electrical performance and reliability can be realized.

Further, a first inventive optical module comprises a base member having a semiconductor device mounting portion comprised of a higher located first area to have optical semiconductor devices mounted on its outer surface and a second area which is stepped down from the first area so as to be located lower than the first area; and a waveguide mounting portion where the optical waveguide to be optically coupled to the optical semiconductor devices is to be mounted; an insulation layer provided in the second area of the base member so as to have substantially the same height as the first area and having a smaller dielectric loss tangent than the base member; driving electrode patterns provided on the insulation layer for driving the optical semiconductor devices; optical semiconductor devices mounted in the first area of the semiconductor device mounting portion; and an optical waveguide mounted in the waveguide mounting portion to be optically coupled to the optical semiconductor devices.

In such an optical module, since the insulation layer provided in the second area of the base member has a smaller dielectric loss tangent than the base member, the loss in the driving electrode patterns provided on the insulation layer can be small even if drive signals fed to the optical semiconductor devices are high-frequency signals. Therefore, an optical module having excellent electrical performance and reliability can be realized.

A second inventive substrate for mounting an optical component comprises a base member having a semiconductor device mounting portion where optical semiconductor devices are to be mounted and a waveguide mounting portion formed with a groove for mounting the optical waveguide to be optically coupled to the optical semiconductor devices; a first insulation film formed on the outer surface of the semiconductor device mounting portion of the base member; a second insulation film which is so formed on the outer surface of the semiconductor device mounting portion of the base member as to expose at least a portion of the first insulation film and is thicker than the first insulation film; mounting electrode patterns for mounting the optical semiconductor devices which patterns are formed to extend over the first insulation film; and driving electrode patterns for driving the optical semiconductor devices which patterns are formed to extend over the second insulation films.

In such a substrate for mounting an optical component, since the driving electrode patterns are provided on the second insulation film which is thicker and formed in the semiconductor device mounting portion of the base member, the loss in the driving electrode patterns provided on the second insulation film can be small even if drive signals fed to the optical semiconductor devices are high-frequency signals. Therefore, a substrate for mounting an optical component having excellent electrical performance and reliability can be realized.

The second substrate for mounting an optical component may further include the alignment markers for the optical semiconductor devices which markers are formed in the first insulation film and positioned with respect to the groove.

With such a construction, the optical semiconductor devices can be highly precisely positioned in the first area based on the alignment markers, with the result that a substrate for mounting an optical component having excellent electrical performance and reliability can be realized.

In the second substrate for mounting an optical component, the mounting electrode patterns may be formed so as to correspond to the alignment markers.

With such a construction, the optical semiconductor devices can be highly precisely positioned on the mounting electrode patterns based on the alignment markers.

Further, in the second substrate for mounting an optical component, solder patterns may be formed on the mounting electrode patterns formed on the first insulation film.

With such a construction, the optical semiconductor devices can be securely mounted on the base member since being connected to the mounting electrode patterns via the solder patterns.

Further, in the second substrate for mounting an optical component, the groove for stopping the optical waveguide may be formed between the semiconductor device mounting portion and the waveguide mounting portion of the base member.

With such a construction, the leading end of the optical waveguide mounted in the groove formed in the waveguide mounting portion can be precisely positioned by the optical waveguide stopping groove.

A second inventive optical module comprises a base member having a semiconductor device mounting portion where optical semiconductor devices are to be mounted and a waveguide mounting portion formed with a groove for mounting the optical waveguide to be optically coupled to the optical semiconductor devices; a first insulation film formed on the outer surface of the semiconductor device mounting portion of the base member; a second insulation film which is so formed on the outer surface of the semiconductor device mounting portion of the base member as to expose at least a portion of the first insulation film and is thicker than the first insulation film; semiconductor device alignment markers formed in the first insulation film and positioned with respect to the waveguide mounting groove; mounting electrode patterns for mounting the optical semiconductor devices which patterns are formed to extend over the first insulation film; driving electrode patterns for driving the optical semiconductor devices which patterns are formed to extend over the second insulation film; and an optical waveguide mounted in the waveguide mounting groove: and optical semiconductor devices mounted on the mounting electrode patterns formed on the first insulation film to be optically coupled to the optical waveguide.

In such an optical module, since the driving electrode patterns are provided on the second insulation film which is thicker and formed in the semiconductor device mounting portion of the base member, the loss in the driving electrode patterns provided on the second insulation film can be small even if drive signals fed to the optical semiconductor devices are high-frequency signals. Therefore, an optical module having excellent electrical performance and reliability can be realized.

It should be appreciated that, in any of the foregoing embodiments, the base member is not limited to those made of a silicon monocrystal as described above, but may be made of a ceramic, a synthetic resin or like material.

This application is based on patent application Nos. 11-185820 and 11-247928 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A substrate for mounting an optical component, comprising:
    a base member having a semiconductor device mounting portion including a higher located first area to have an optical semiconductor device mounted on its outer surface and a second area which is stepped down from the first area so as to be located lower than the first area;
    an insulation layer provided in the second area of the base member so as to have substantially the same height as the first area and having a smaller dielectric loss tangent than the base member; and
    a driving electrode pattern provided on the insulation layer for driving the optical semiconductor device.

2. A substrate for mounting an optical component according to claim 1, wherein the optical semiconductor device is mounted in the first area of the base member.

3. A substrate for mounting an optical component according to claim 2, wherein a mounting electrode pattern is formed in the first area of the base member and the optical semiconductor device is electrically connected with the mounting electrode pattern.

4. A substrate for mounting an optical component according to claim 3, wherein a solder pattern is formed on the mounting electrode pattern in the first area, and the optical semiconductor device is electrically connected to the mounting electrode pattern via the solder pattern.

5. A substrate for mounting an optical component according to claim 1, wherein the base member further includes a waveguide mounting portion where the optical waveguide to be optically coupled with the optical semiconductor device mounted in the semiconductor device mounting portion is to be mounted.

6. A substrate for mounting an optical component according to claim 5, a groove for mounting the optical waveguide is formed in the outer surface of the waveguide mounting portion.

7. A substrate for mounting an optical component according to claim 5, wherein a groove for stopping the optical waveguide is formed between the semiconductor device mounting portion and the waveguide mounting portion of the base member.

8. A substrate for mounting an optical component according to claim 1, the step is formed by applying anisotropic etching to the base member.

9. A substrate for mounting an optical component according to claim 1, wherein the insulation layer is provided in the first area of the base member, and alignment markers in the form of openings for positioning the optical semiconductor device being mounted are formed in the insulation layer.

10. An optical module, comprising:
    a base member including a semiconductor device mounting portion having a higher located first area to have an optical semiconductor device mounted on its outer surface and a second area which is stepped down from the first area so as to be located lower than the first area, and a waveguide mounting portion where a optical waveguide to be optically coupled to the optical semiconductor device is to be mounted;
    an insulation layer provided in the second area of the base member so as to have substantially the same height as the first area and having a smaller dielectric loss tangent than the base member;
    a driving electrode pattern provided on the insulation layer for driving the optical semiconductor device;
    an optical semiconductor device mounted in the first area of the semiconductor device mounting portion; and
    an optical waveguide mounted in the waveguide mounting portion to be optically coupled to the optical semiconductor device.

11. A substrate for mounting an optical component, comprising:
    a base member having a semiconductor device mounting portion where an optical semiconductor device is to be mounted and a waveguide mounting portion formed with a groove for mounting an optical waveguide to be optically coupled to the optical semiconductor device;

a first insulation film formed on an outer surface of the semiconductor device mounting portion of the base member;

a second insulation film which is so formed on an outer surface of the semiconductor device mounting portion of the base member as to expose at least a portion of the first insulation film and is thicker than the first insulation film;

a mounting electrode pattern for mounting the optical semiconductor device which pattern is formed to extend over the first insulation film; and a driving electrode pattern for driving the optical semiconductor device which pattern is formed to extend over the second insulation film.

12. A substrate for mounting an optical component according to claim 11, further comprising an alignment marker for mounting the optical semiconductor device, the alignment marker being formed in the first insulation film and positioned with respect to the groove.

13. A substrate for mounting an optical component according to claim 12, wherein the mounting electrode pattern is formed so as to correspond to the alignment marker.

14. A substrate for mounting an optical component according to claim 13, wherein a solder pattern is formed on the mounting electrode pattern on the first insulation film.

15. A substrate for mounting an optical component according to claim 11, wherein the base member further includes a groove for stopping the optical waveguide, the groove being formed between the semiconductor device mounting portion and the waveguide mounting portion.

16. An optical module, comprising:

a base member having a semiconductor device mounting portion where an optical semiconductor device is to be mounted and a waveguide mounting portion formed with a groove for mounting an optical waveguide to be optically coupled to the optical semiconductor device;

a first insulation film formed on an outer surface of the semiconductor device mounting portion of the base member;

a second insulation film which is so formed on an outer surface of the semiconductor device mounting portion of the base member as to expose at least a portion of the first insulation film and is thicker than the first insulation film;

a semiconductor device alignment marker formed in the first insulation film and positioned with respect to the waveguide mounting groove;

a mounting electrode pattern for mounting the optical semiconductor device which pattern is formed to extend over the first insulation film;

a driving electrode pattern for driving the optical semiconductor device which pattern is formed to extend over the second insulation film; an optical waveguide mounted in the waveguide mounting groove; and an optical semiconductor device mounted on the mounting electrode pattern formed over the first insulation film to be optically coupled to the optical waveguide.

* * * * *